United States Patent
Watanabe

(10) Patent No.: US 7,414,390 B2
(45) Date of Patent: Aug. 19, 2008

(54) SIGNAL DETECTION CONTACTOR AND SIGNAL CALIBRATION SYSTEM

(75) Inventor: Chihiro Watanabe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 180 days.

(21) Appl. No.: 11/227,324

(22) Filed: Sep. 16, 2005

(65) Prior Publication Data

US 2006/0006859 A1    Jan. 12, 2006

Related U.S. Application Data

(62) Division of application No. 10/485,259, filed as application No. PCT/JP03/02576 on Mar. 5, 2003, now Pat. No. 6,963,198.

(30) Foreign Application Priority Data

Apr. 17, 2002  (JP) .............................. 2002-114950

(51) Int. Cl.
*G01R 31/28* (2006.01)
(52) U.S. Cl. ..................................... 324/158.1; 324/754
(58) Field of Classification Search ................. 324/754, 324/158.1
See application file for complete search history.

(56) References Cited

U.S. PATENT DOCUMENTS

| 4,138,643 | A |   | 2/1979  | Beck et al. |
|-----------|---|---|---------|-------------|
| 5,291,129 | A |   | 3/1994  | Kazama |
| 5,539,305 | A |   | 7/1996  | Botka |
| 5,561,377 | A | * | 10/1996 | Strid et al. ................... 324/754 |
| 5,793,218 | A |   | 8/1998  | Oster et al. |
| 5,973,505 | A |   | 10/1999 | Strid et al. |
| 6,300,757 | B1 |  | 10/2001 | Janssen |
| 6,417,682 | B1 |  | 7/2002  | Suzuki et al. |
| 6,445,172 | B1 |  | 9/2002  | Park et al. |
| 2002/0030480 | A1 | | 3/2002 | Appen et al. |

FOREIGN PATENT DOCUMENTS

| DE | 199 22 907 A1 | 12/1999 |
| JP | 2000-352578   | 12/2000 |
| JP | 2001-42002    | 2/2001  |
| JP | 2001-68516    | 3/2001  |

* cited by examiner

*Primary Examiner*—Ernest F Karlsen
(74) *Attorney, Agent, or Firm*—Oblon, Spivak, McClelland, Maier & Neustadt, P.C.

(57) ABSTRACT

A signal detection contactor has a contactor main body and a plurality of coaxial bodies. Each coaxial body includes a core wire. The core wire is used for coming into contact with a probe of a prober and for receiving a signal transmitted from a tester, in order to calibrate a phase difference among signals transmitted through a plurality of probes.

2 Claims, 3 Drawing Sheets

SIGNAL DETECTION CONTACTOR AND
SIGNAL CALIBRATION SYSTEM

This application is based upon and claims the benefit of priority under 35 U.S.C. § 120 from U.S. application Ser. No. 10/485,259, filed Feb. 9, 2004, which is a national stage of PCT/JP03/02576, filed Mar. 5, 2003, and under 35 U.S.C. § 119 from the prior Japanese Patent Application No. 2002-114950, filed Apr. 17, 2002, the entire contents of which are incorporated herein by reference.

TECHNICAL FIELD

The present invention relates to a signal detection contactor and signal calibration system used when calibrating a signal for testing the electrical characteristics of, e.g., a high-speed device.

BACKGROUND ART

In the manufacturing process for a semiconductor device or the like, when testing the electrical characteristics of a target test object (to be referred to as "device" hereinafter) formed on a wafer-like substrate (to be merely referred to as "wafer" hereinafter) W, a prober shown in, e.g., FIGS. 4A and 4B, is used. The prober has a loader chamber 1 and prober chamber 2. A test head T for a tester 27 is pivotally arranged on a head plate 9 arranged on the prober chamber 2. The test head T is electrically connected to a probe card 7 and a plurality of probes 7A provided to the probe card through a performance board (not shown). A test signal transmitted from the tester 27 is sent to the probes 7A through the test head T and the performance board. The probes 7A apply test signals to the electrode pads of a device formed on the wafer W. Thus, the electrical characteristics of the device, e.g., a plurality of semiconductor devices (chips), formed on the wafer W are tested.

The test signals are transmitted from the tester 27 to the probes 7A through signal lines. If all the signal lines and the probes 7A have the same physical characteristics, the test signals can be correctly transmitted to the plurality of probes 7A through the performance board. Therefore, the probes 7A can apply the test signals to the electrode pads with the same phase, so that the device can be tested correctly. Due to a slight difference in the manufacturing process, however, sometimes the physical characteristics of the respective signal lines and the respective probes 7A differ slightly from each other. As the test signals are very sensitive, a slight difference in physical characteristics of the probes 7A may sometimes cause, e.g., a phase difference, among the test signals that have arrived the distal ends of the probes 7A. If the test signals have a phase difference or the like, it is difficult to correctly test the device.

As a technique for calibrating the phase difference of the signals, for example, Jpn. Pat. Appln. KOKAI Publication No. 2000-352578 discloses a technique related to a timing calibration method for an IC test device. According to the timing calibration method described in Jpn. Pat. Appln. KOKAI Publication No. 2000-352578, delay time difference among signals from times at the signal generation to times at the signal arrival due to difference in the length of signal transmission lines of the IC test device can be calibrated. Due to the manufacturing process or the like, however, if the physical characteristics of the signal lines or the like differ slightly, and accordingly the timings at which signals of the respective signal lines arrive differ, this difference in timing cannot be calibrated. This timing calibration method is concerned with an IC test device. In the prober, the arrival times of signals, which transmitted from the tester to the probe card, differ depending on the physical characteristics of the respective signal lines. It is recognized that, in order to calibrate the arrival times of the respective signals, the signals must be detected at the distal ends of the respective probes. It is, however, difficult to detect the signals at the distal ends of the probes, and accordingly it is difficult to detect and calibrate the difference among the plurality of test signals.

DISCLOSURE OF INVENTION

The invention of the present application has been made to solve at least one of the problems described above. According to one aspect of the present invention, there is provided a signal detection contactor which can reliably detect a signal from the distal end of a probe. According to another aspect of the present invention, there is provided a signal detection contactor which has excellent RF characteristics and can obtain a stable contact state with a probe.

According to a further aspect of the present invention, there is provided a signal calibration system which can detect and calibrate signals from the distal end of probes.

The further problems and advantages of the present invention will be described hereinafter, part of which is obvious from the disclosure thereof, or will become apparent by practicing the present invention. The objects and advantages of the present invention can be realized by means particularly indicated herein and a combination thereof.

According to the first aspect of the present invention, there is provided, in an apparatus which applies a signal from a signal source to a target through at least one terminal, a signal detection contactor to receive and detect the signal to be applied by the terminal to an electrode of the target by coming into contact with the terminal.

The signal detection contactor based on the first aspect of the present invention can comprise either one of the following preferable arrangements (1) to (9), or a combination of any plurality of the following arrangements.

(1) The signal detection contactor comprises a contactor main body and at least one coaxial body. The coaxial body comprises a core wire. The core wire comes into contact with the terminal to receive a signal.

(2) In a prober which causes a plurality of probes and a plurality of electrodes of a target test object to come into contact with each other, and tests electrical characteristics of the target test object based on a signal from a tester, the signal detection contactor detects test signals applied by the tester to each electrode through each probe. The probe is a terminal, the device is a target, and the tester is a signal source.

(3) The signal detection contactor comprises a plurality of coaxial bodies, and is used for calibrating a phase difference among signals transmitted through the plurality of probes.

(4) The signal detection contactor includes a conductor surface with which at least probes other than the probe which comes into contact with the core wire is to come into contact.

(5) The contactor includes an insulator which covers an outer surface of an upper end face of a core wire which is to come into contact with a probe.

(6) The core wire is made of a hard metal.

(7) The core wire is made of tungsten carbide.

(8) The core wire comprises an upper end face which comes into contact with a probe, and a main body portion continuous to the upper end face. The diameter of the upper end face is smaller than that of the main body portion.

(9) An upper end face of a core wire which is to come into contact with a probe on a surface of the contactor main body is dull-finished.

According to another aspect of the present invention, in a prober which transmits signals through a plurality of probes to test electrical characteristics of a target test object, there is provided, a signal calibration system to calibrate a signal applied by at least one probe on an electrode of the target test object. The signal calibration system based on this another aspect of the present invention can further comprise at least one of the following preferred arrangements (1) to (11), or an arrangement as a combination of any plurality of the following arrangements.

(1) A signal calibration system comprises a signal detection contactor (the signal detection contactor including a contactor main body and at least one coaxial body comprising a core wire, the core wire coming into contact with a probe to receive a signal transmitted from the probe) and a signal calibration unit which calibrates a signal received by a core wire of a coaxial body.

(2) The signal calibration system comprises a moving mechanism to move a signal detection contactor in a horizontal direction and an elevating mechanism to move the signal detection contactor in a vertical direction.

(3) The signal calibration system comprises a signal detection body which detects a signal from a coaxial body of a signal detection contactor.

(4) The detection contactor includes a plurality of coaxial bodies. The coaxial bodies are arranged in the contactor main body with a layout different from that of the plurality of probes.

(5) A core wire provided to the coaxial body comes into contact with a probe on an upper end face which is exposed to an outer surface at least at one portion of a surface of a contactor main body.

(6) The contactor includes a plurality of coaxial bodies each including a core wire corresponding to a type of the signal.

(7) The contactor has an insulator which covers an outer surface of an upper end face of a core wire which is to come into contact with a probe.

(8) The core wire is made of a hard metal.

(9) The core wire is made of tungsten carbide.

(10) The core wire comprises an upper end face which is to come into contact with a probe, and a main body portion continuous to the upper end face. The diameter of the upper end face is smaller than that of the main body portion.

(11) An upper end face of a core wire which comes into contact with a probe on a surface of the contactor main body is dull-finished.

According to another aspect of the present invention, there is provided, in a prober which transmits signals through a plurality of probes to test electrical characteristics of a target test object, a method of calibrating a test signal in a signal calibration system to calibrate a signal applied by at least one probe to an electrode of the target test object. This method comprises the following. (a) At least one probe and at least one core wire of a coaxial body provided to a signal detection contactor are brought into contact with each other. (b) A signal is transmitted from a tester provided to the prober to a probe which is in contact with a core wire. (c) The signal transmitted to the probe is applied to the core wire which is in contact with the probe. (d) The signal applied to the core wire is transmitted to the tester. (e) The signal applied to the core wire and transmitted to the tester is calibrated by the tester. (f) The steps (b) to (e) are repeatedly performed to calibrate signals transmitted to the other probes.

BRIEF DESCRIPTION OF DRAWINGS

The accompanying drawings are incorporated in and form a part of the specification to show a preferable embodiment of the present invention. The drawings are used in the description of the present invention by way of general description made above and a detailed description concerning the preferable embodiment to be described below.

FIGS. 2A and 2B are views showing an embodiment of a contactor according to the present invention, in which FIG. 2A is a sectional view of the same, and FIG. 2B is a plan view of the same.

FIGS. 4A and 4B are views showing an example of a prober, in which FIG. 4A is a partially cutaway front view of the front surface of a prober, and FIG. 4B is a plan view showing the interiors of a loader chamber and prober chamber.

BEST MODE FOR CARRYING OUT THE INVENTION

The invention of the present application provides, in an apparatus which applies a signal from a signal source to a target through at least one terminal, a signal detection contactor to receive and detect the signal to be applied by the terminal to the electrode of the target by coming into contact with the terminal, and a signal calibration system and a method of calibrating a signal to calibrate the signal applied to the target. Various types of apparatuses are used as the apparatus which applies a signal to a target. To describe the invention of the present application more specifically, a prober which tests the electrical characteristics of a device will be described.

Figure 1:
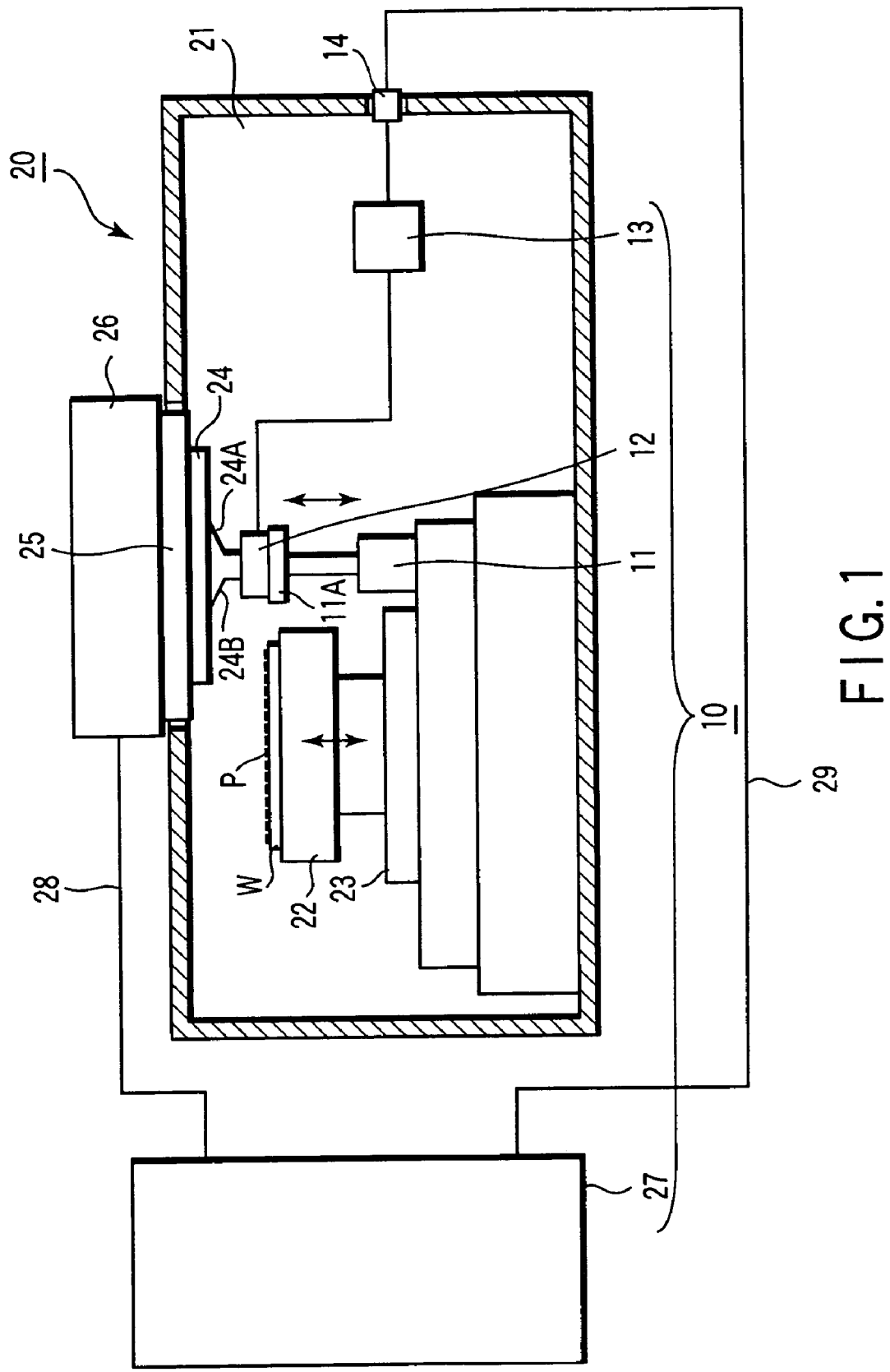
FIG. 1 is a conceptual view showing a signal calibration system according to one embodiment of the present invention.

The signal calibration system according to the invention of the present application will be described by way of the embodiment shown in FIGS. 1 to 3. In this embodiment, the signal detection contactor and the method of calibrating a signal according to an embodiment of the invention of the present application will also be described. As shown in FIG. 1, a signal calibration system 10 according to this embodiment detects and calibrates a signal for testing a device in a prober 20. The signal calibration system 10 can use a signal detection contactor 12 described above. The prober 20 has an elevatable stage (e.g. main chuck) 22 in a prober chamber 21. The stage 22 can horizontally move in X and Y directions by an X-Y table 23. A probe card 24 is arranged above the stage 22. The probe card 24 can be electrically connected to a test head 26 through a performance board 25. The test head 26 can also be connected to a tester 27. The probe card 24, performance board 25, test head 26, and tester 27 can be electrically connected to each other through 50 Ω coaxial cables 28. When testing a wafer, an alignment mechanism (not shown) and the X-Y table 23 cooperate with each other to align the electrode pads of a device formed on the wafer placed on the stage 22 with probes 24A provided to the probe card 24. After that, the stage 22 moves upward in the Z direction. The electrode pads of the wafer and the probes 24A are brought into electrical contact with each other. The electrical characteristics of the wafer are tested based on a plurality of test signals from the tester 27.

The signal calibration system 10 according to this embodiment may comprise the signal detection contactor (to be merely referred to as "contactor" hereinafter) 12, the signal calibration unit 27 for calibrating the signals, an elevating mechanism (e.g., elevating cylinder) 11 added to the X-Y table 23, and a signal detection body (to be referred to as "signal detection board" hereinafter) 13.

The contactor 12 is fixed on a support 11A at the upper end of the rod of the elevating cylinder 11, and can come into electrical contact with the probes 24A of the probe card 24. The signal detection board 13 can be electrically connected to the contactor 12, and to the signal calibration unit through a connector 14.

The signal calibration unit 27 outputs signals to the probes through the test head 26. The signal detection board 13 obtains the waveforms of the signals through the contactor in electrical contact with the probes. Hence, delay times and voltage levels of the signals can be detected.

The signal detection board 13 can also have the function of outputting signals. When the signal detection board 13 outputs signals, the test head 26 serves as a signal detection board.

The signal calibration unit 27 calibrates, e.g., the levels and waveforms of the signals and a phase difference among the signals. In this embodiment, a tester is used as the signal calibration unit 27, but the present invention is not limited to this. The signal calibration unit 27 may be provided independently of the tester, or can be built into the tester. In the following description, the signal calibration unit 27 serves as the tester 27. The contactor 12, signal detection board 13, connector 14, and tester 27 can be connected to each other through 50 Ω coaxial cables 29.

FIG. 1 is a view in which the contactor 12 is in contact with the probes 24A. When testing the wafer, the upper surface of the contactor 12 can be set at a position lower than the wafer stage surface of the stage 22, so it will not hinder wafer test.

Figure 2A:
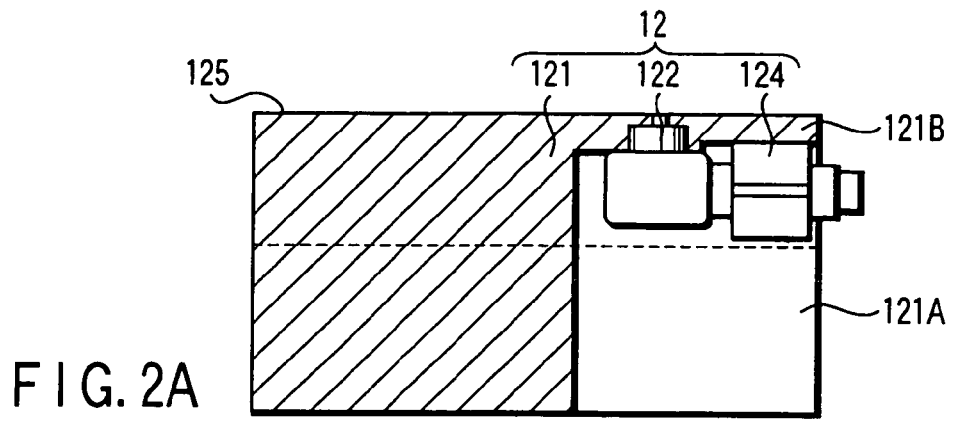
Figure 2B:
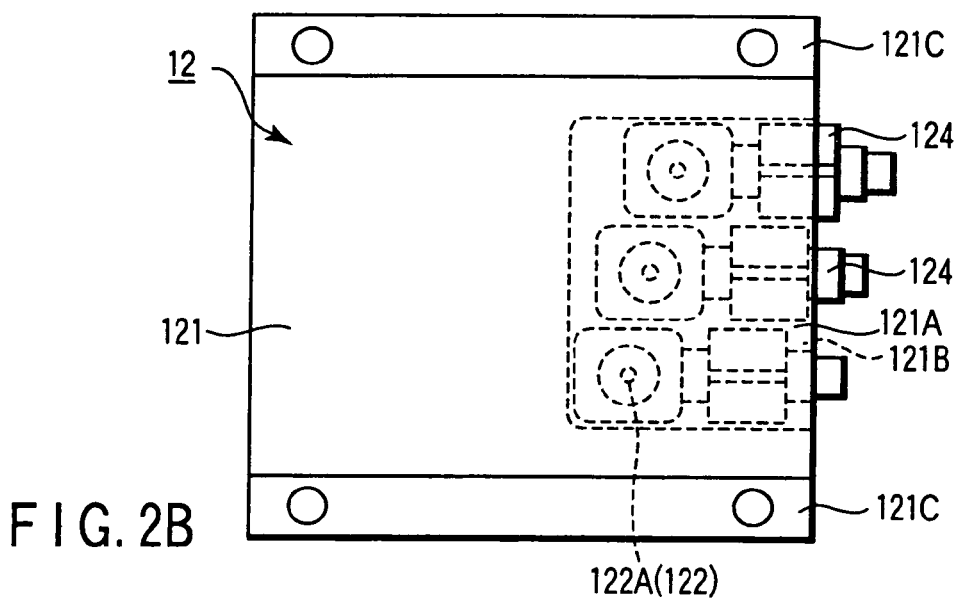

As shown in, e.g., FIGS. 2A and 2B, the contactor 12 of this embodiment can have a contactor main body 121, and at least one coaxial body 122 provided to the contactor main body 121. The coaxial body 122 can comprise a core wire 122A. When the core wire 122A comes into contact with a corresponding probe 24A, a test signal arriving the distal end of the probe 24A can be received. The signal received by the core wire 122A can be transmitted to the tester 27 through the signal detection board 13 and connector 14 shown in FIG. 1. The tester 27 can calibrate the phase differences among the plurality of signals transmitted to it. The tester 27 can also calibrate the waveforms and signal levels of the respective signals.

As shown in FIG. 2, the contactor main body 121 can be made of, e.g., a metal. In this embodiment, a rectangular structure made of an iron alloy is employed. One or a plurality of coaxial bodies 122 can be provided to the contactor 12. The contactor of this embodiment has three coaxial bodies. The three coaxial bodies 122 are used as a driver coaxial body, a comparator coaxial body, and a waveform monitor coaxial body, respectively. The plurality of coaxial bodies 122 can be arranged in the contactor main body 121 with a layout different from that of the plurality of probes. In this embodiment, the coaxial bodies 122 can be arranged obliquely on one side surface of the contactor main body 121, as shown in FIG. 2B. When the coaxial bodies 122 have an oblique layout, they can be shifted from the layout of the probes 24A. If the layout of the coaxial bodies and the layout of the probes are shifted from each other, when one coaxial body 122 is in contact with one probe 24A, the other coaxial bodies 122 can be prevented from coming into contact with the other probes 24A.

Figure 3:
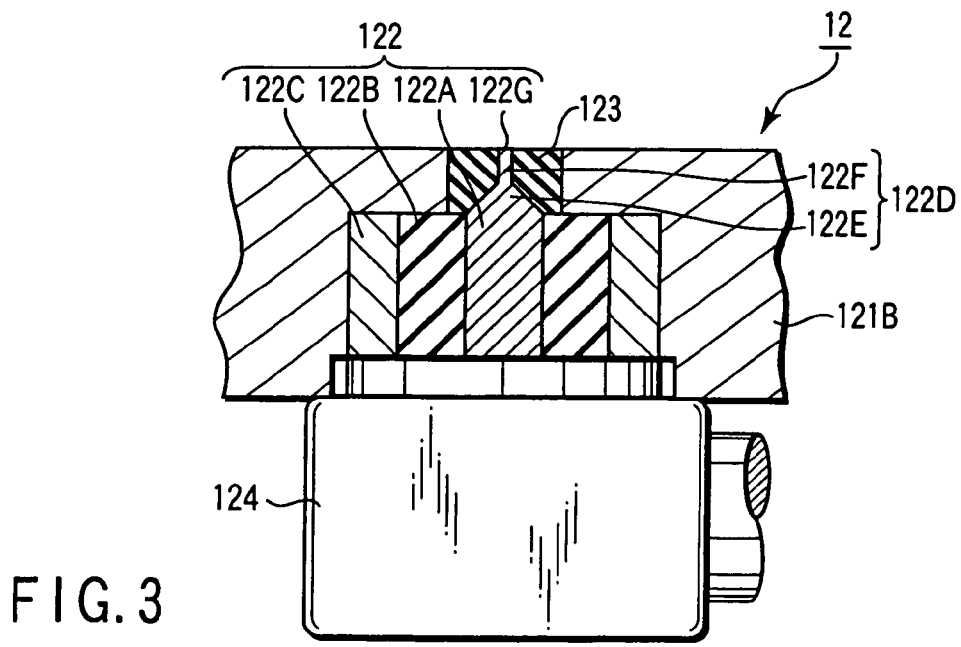
FIG. 3 is an enlarged sectional view of the coaxial body portion of the contactor shown in FIG. 2A.
Figure 4A:
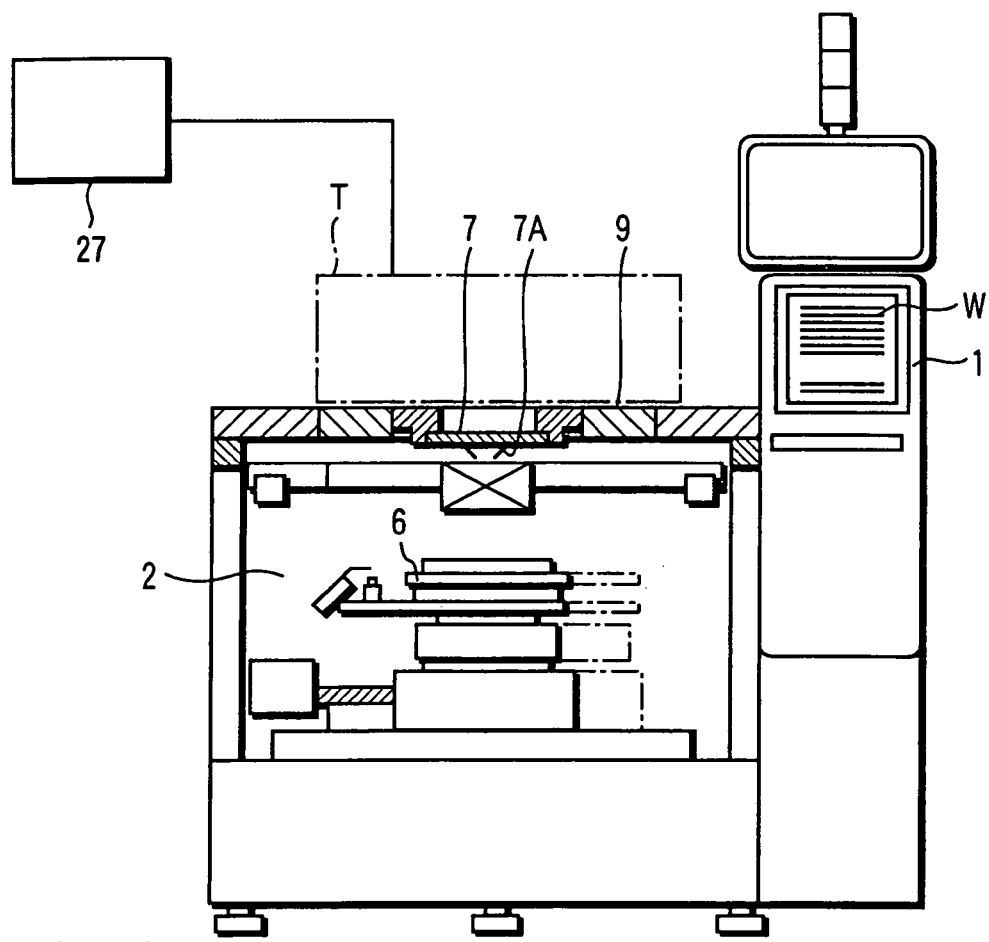
Figure 4B:
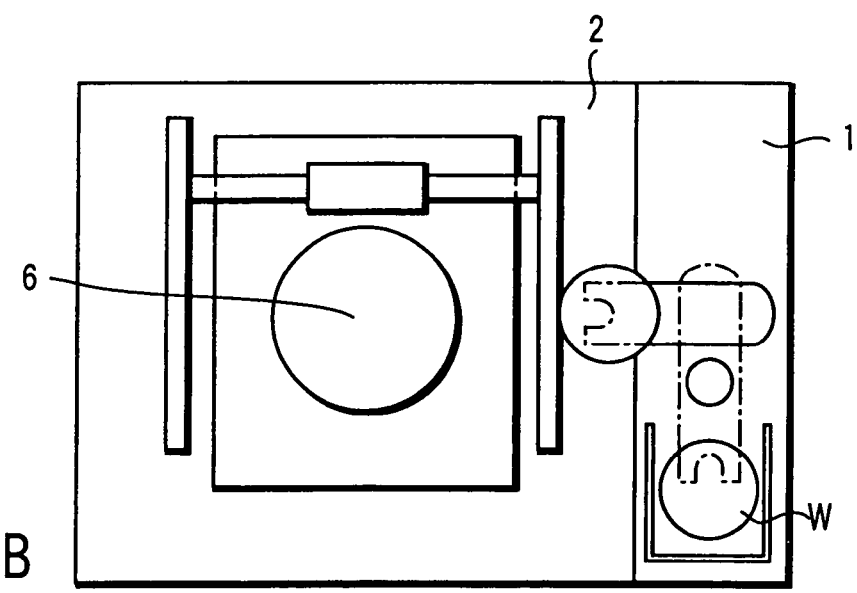

The core wire 122A provided to the coaxial body 122 of FIG. 3 has its upper end face 122G exposed at least at one portion of the surface of the contactor main body, so that it can come into contact with the corresponding probe 24A. The position of the core wire 122A is not limited to this, and the core wire 122A can be arranged at any position where it can come into contact with the corresponding probe 24A on the contactor.

When a test signal deriving portion is formed as the coaxial body 122, a contactor 12 having excellent frequency characteristics with which even a high frequency will not attenuate easily can be provided. Consequently, even an RF signal can be calibrated reliably. The flat surface of the contactor main body 121 can have a size of, e.g., a 40-mm square.

A cutout portion 121A can be formed in one side surface (right surface in FIGS. 2A and 2B) of the contactor main body 121. A plate-like portion 121B can be formed on the upper side of the cutout portion 121A. For example, the three coaxial bodies 122 can be buried in the plate-like portion 121B. The cutout portion 121A can accommodate coaxial connectors 124 connected to the coaxial bodies 122. When a cutout portion is formed in the contactor main body, coaxial bodies and the like can be arranged easily. Flanges 121C are formed on the left and right of (top and bottom in FIG. 2B) the contactor main body 121. The contactor main body 121 can be fixed to the support 11A of the elevating cylinder 11 through the flanges 121C.

The contactor can have a conductor surface 125 with which at least part of a probe other than the probe which comes into contact with the core wire 122A comes into contact. The conductor surface 125 can be formed by, e.g., nickel plating performed on the surface of the contactor main body 121. Thus, impedance matching can be performed between the probe 24A in contact with the core wire 122A and a probe 24A in contact with the nickel-plated 125 portion.

The signals are transmitted from the tester 27 to the probe card 24 through the coaxial cables 28. However, the probes 24A themselves cannot have coaxial structures. Therefore, when the signals are transmitted from the probe card 24, signal reflection may occur on the distal ends of the probes 24A due to impedance mismatching, causing disturbance in the signal waveforms. Concerning this, according to the present invention, a test signal probe 24A and a ground probe 24B can be arranged on the probe card 24. The ground probe 24B of the coaxial cable 28 can be arranged adjacent to the test signal probe 24 of the coaxial cable 28 corresponding to this ground probe 24B. Therefore, when the signal probe 24A comes into contact with the upper end face 122G of the core wire 122A provided to the contactor main body 121, the ground probe 24B comes into contact with the nickel-plated portion of the contactor main body 121 simultaneously. Thus, an impedance of 50 Ω can be maintained in the entire signal transmission lines, and signal reflection or the like from the distal ends of the other probes 24A (probes other than the probe 24A in contact with the contactor 12) can be prevented. That surface of the contactor main body 121 with which the other probes 24A come into contact is grounded to the ground of the coaxial connectors 124 connected from the contactor main body 121 to the tester 27. Thus, signals can be detected more correctly.

FIG. 3 is an enlarged sectional view of the buried portion of the coaxial body 122 in FIG. 2A. This coaxial body 122 may have the core wire 122A, an insulating layer 122B, and a conductor layer 122C. The insulating layer 122B covers the outer surface of the core wire 122A. The conductor layer 122C covers the outer surface of the insulating layer 122B. Part of the core wire 122A can have a projection 122D projecting upward from the upper ends of the insulating layer 122B and conductor layer 122C. This core wire has the upper end face 122G to come into contact with the probe, and the main body portion 122A continuous to the upper end face. The diameter of the upper end face 122G can be smaller than that of the main body portion. For example, the projection 122D of the core wire 122A can be comprised of a tapered portion 122E and small-diameter portion 122F. The diameter of the tapered portion 122E gradually decreases upward. The small-diameter portion 122F projects from the tapered portion 122E toward the upper end. In this embodiment, the projection 122D, i.e., the upper end face 122G of the core wire 122A, can be formed, e.g., with a diameter of 80 µm corresponding to the size of the electrode pad of the wafer. In this manner, since the upper end face 122G of the core wire to come into contact with the probe can have a desired diameter, the upper end face 122G can be formed in accordance with the density of the probes 24A.

Furthermore, the contactor main body 121 can have an insulator 123 for covering the outer surface of the upper end face 122G of the core wire to come into contact with the probe 24A. For example, the projection 122D can be covered with the insulator 123 on the surface layer portion of the plate-like portion 121B. When the upper end face 122G of the core wire 122A is covered with the insulator 123, the probe 24A to come into contact with the core wire 122A and a probe 24A adjacent to it can be electrically insulated from each other reliably. The insulator 123 can be provided to share the axis with the tapered portion 122E. The surfaces of the projection 122D and insulator 123 can be flush with the plate-like portion 121B.

The core wire 122A can be made of an ultrafine-particle hard metal, and can be made of, e.g., tungsten carbide. The insulator 123 can be made of an insulating material such as glass. Since the core wire 122A is made of an ultrafine-particle hard metal, it is resistant against wear by contact with the probe 24A, thus providing a structure with excellent durability.

Furthermore, the upper end face 122G of the core wire 122A to come into contact with the probe on the surface of the contactor main body can be dull-finished. Then, the upper end face 122G of the core wire reliably grips the needle point of the probe 24A, so that a stable contact state can be obtained.

The operation will be described. Prior to wafer test using the prober 20, the test signal used for wafer test is calibrated by using the signal calibration system 10. For this purpose, first, the position coordinates of the three core wires 122A on the contactor 12 fixed to the elevating cylinder 11 are input as initial setting. In this case, the images of the core wires which can be sensed by a camera provided for the alignment mechanism (not shown) of the prober, can be input, or can be directly input by using a ten-key pad. Subsequent to the position coordinates of the core wires, the position coordinates of the plurality of probes 24A are input. In this case as well, the position coordinates can be input by using the camera provided to the alignment mechanism, or can be directly input by using the ten-key pad or the like. After this initial setting is ended, the position information of the probes 24A and core wires 122A are transmitted to the prober 20.

In the prober 20, the alignment mechanism brings the specified probes 24A and specified core wires 122A in contact with each other based on these pieces of information. More specifically, the X-Y table 23 moves the contactor 12 in the X or Y direction, to align the upper end faces 122G of the core wires provided to the coaxial bodies 122, and the probes 24A with each other. Subsequently, the elevating cylinder 11 moves the contactor 12 upward to be higher than the stage surface of the stage 22. Then, as shown in FIG. 1, the upper end faces 122G of the core wires and the needle points of the probes 24A can come into contact with each other. At this time, when the upper end faces 122G of the core wires 122A are dull-finished, a stable contact state can be obtained between the needle points of the probes 24A and the upper end faces 122G of the core wires 122A. Thus, contact between the needle points of the probes 24A and the upper end faces 122G of the core wires 122A is stabilized, and the core wires 122A can reliably receive the signals from the probes 24A. At this time, the probe 24A for applying a driver test signal can come into contact with the driver core wire 122A. The probe 24A for applying a comparator test signal can come into contact with the comparator core wire 122A.

With the core wires 122A and the probes 24A being in contact with each other, the tester 27 transmits predetermined test signals to the probe card 24. The test signals arrive the probes 24A through the respective signal wires of the test head 26 and performance board 25, and are applied to the core wires 122A from the probes 24A. The signals received by the contactor 12 are detected by the signal detection board 13, and are transmitted to the tester 27. Alternatively, the signals received by the contactor 12 may be directly transmitted to the tester 27 and detected by it. The test signals are transmitted through the coaxial bodies 122 in the contactor 12. Thus, even if the signals arriving the probe card 24 are RF test signals, they can be correctly transmitted to the tester 27. The tester 27 measures the time taken from transmission to reception of the test signals, and analyzes the waveforms and signal levels of the received test signals, so that the respective signals can be calibrated.

When signal analysis for one probe 24A is ended, the tester 27 repeats measurement described above for all the remaining probes 24A. The tester 27 compares the arrival times of all the test signals taken from transmission to reception, and refers to, e.g., that test signal which has the longest arrival time, as a reference, to equalize the arrival times of the other test signals, so that the phase difference among the signals can be calibrated. Alternatively, the tester 27 may refer to the arrival time of a desired signal to calibrate the other signals. In this manner, the phases of all test signals can be equalized.

The present invention is not limited to the above embodiment at all. For example, it suffices as far as the contactor 12 has at least one coaxial body 122. The number of coaxial bodies can be increased as necessary. As the material of the core wire 122A, an ultrafine-particle hard metal other than tungsten carbide can be used. To form the insulator 123 surrounding the core wire 122A, an insulating material other than glass can be used.

According to the embodiment of the invention of the present application, a signal at the distal end of a probe is detected by using a signal detection contactor. With this arrangement, a difference in signal arrival times caused by a variation in electrical characteristics of the respective signal lines and respective probes due to a variation in the manufacturing process can be detected reliably. Thus, a signal calibration system that can correctly calibrate a signal used for device measurement can be provided.

According to the embodiment of the invention of the present application, because of the presence of the coaxial body, a signal detection contactor which has excellent RF characteristics and can measure a signal correctly and reliably can be provided.

According to the embodiment of the invention of the present application, since the signal detection contactor has a conductor surface, impedance matching can be obtained between a probe in contact with the coaxial body and a probe in contact with the contactor surface.

According to the embodiment of the invention of the present application, since a signal detection contactor and a signal calibration unit are provided, a phase difference among test signals can be detected and calibrated precisely.

According to the embodiment of the invention of the present application, since the plurality of coaxial bodies are arranged in the contactor with a layout different from that of the plurality of probes, a probe other than the target probe can be prevented from coming into contact with the coaxial body, and the signal of the target probe can be measured precisely.

According to the embodiment of the invention of the present application, the core wire provided to the coaxial body has its upper end face exposed at least at one portion of the surface of the contactor main body, so that it can come into contact with the corresponding probe. The upper end face of the core wire and the conductor surface can form one flat surface. Thus, the probe as the measurement target can come into contact with the upper end face, while the other probes can come into contact with the conductor surface.

According to the embodiment of the invention of the present application, an insulator covers the outer surface of the upper end face of the core wire. Thus, a probe in contact with the core wire and a probe adjacent to it can be electrically insulated from each other reliably.

According to the embodiment of the invention of the present application, the core wire is made of an ultrafine-particle hard metal. Thus, a core wire which is resistant against wear due to contact with the probe and has excellent durability can be provided.

According to the embodiment of the invention of the present application, the diameter of the core wire decreases from its main body portion toward its upper end face. Thus, the upper end face of the core wire can have a desired diameter in accordance with the density of the probes.

The upper end face of the core wire to come into contact with the probe is dull-finished. Thus, a core wire that can reliably grip the needle point of the probe and accordingly can obtain a stable contact state can be provided.

Further features and modifications are easily anticipated by a person skilled in the art. Therefore, the present invention has a wider perspective, and is not limited to the specific detailed description and typical embodiment disclosed herein. Accordingly, various modifications can be made without departing from the spirit and scope of the general idea of the invention defined by the appended claims and an equivalent thereof.

The invention claimed is:

1. In a prober which causes a plurality of probes and a plurality of electrodes of a target test object to come into contact with each other and tests electrical characteristics of the target test object based on signals from a tester, a signal detection contactor to detect a test signal applied by said tester to each electrode through each probe, said signal detection contactor comprising:

a contactor main body; and at least one coaxial body, said coaxial body comprising a core wire, and the core wire configured to come into contact with the probe and to receive the signal, in order to calibrate a phase difference among the signals transmitted through the plurality of probes, wherein said signal detection contactor includes a conductor surface with which at least a probe other than the probe which comes into contact with the core wire is to come into contact, wherein the core wire comprises an ultra-fine particle hard metal.

2. In a prober which causes a plurality of probes and a plurality of electrodes of a target test object to come into contact with each other and tests electrical characteristics of the target test object based on signals from a tester, a signal detection contactor to detect a test signal applied by said tester to each electrode through each probe, said signal detection contactor comprising:

a contactor main body; and at least one coaxial body, said coaxial body comprising a core wire, and the core wire configured to come into contact with the probe to receive the signal, in order to calibrate a phase difference among the signals transmitted through the plurality of probes, wherein said signal detection contactor includes a conductor surface with which at least a probe other than the probe which comes into contact with the core wire is to come into contact, wherein the upper end face of the core wire which comes into contact with the probe on the surface of the contactor main body is dull-finished.

* * * * *